(12) United States Patent
Lee

(10) Patent No.: US 10,176,875 B2
(45) Date of Patent: Jan. 8, 2019

(54) SEMICONDUCTOR MEMORY DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/482,138

(22) Filed: Apr. 7, 2017

(65) Prior Publication Data

US 2018/0040378 A1 Feb. 8, 2018

(30) Foreign Application Priority Data

Aug. 2, 2016 (KR) ........................ 10-2016-0098516

(51) Int. Cl.

| G11C 8/08 | (2006.01) |
|---|---|
| G11C 16/10 | (2006.01) |
| G11C 8/12 | (2006.01) |
| G11C 8/14 | (2006.01) |
| G11C 16/04 | (2006.01) |
| G11C 16/08 | (2006.01) |
| G11C 16/24 | (2006.01) |
| G11C 16/32 | (2006.01) |

(52) U.S. Cl.
CPC ................ G11C 16/10 (2013.01); G11C 8/08 (2013.01); G11C 8/12 (2013.01); G11C 8/14 (2013.01); G11C 16/0483 (2013.01); G11C 16/08 (2013.01); G11C 16/24 (2013.01); G11C 16/32 (2013.01)

(58) Field of Classification Search
CPC ................ G11C 8/12; G11C 8/08; G11C 8/14
USPC ...................................................... 365/185.13
See application file for complete search history.

(56) References Cited

U.S. PATENT DOCUMENTS

| 7,782,661 | B2 * | 8/2010 | Yang | .................... | G11C 11/1655 |
|---|---|---|---|---|---|
| | | | | | 365/158 |
| 2005/0254299 | A1 * | 11/2005 | Tanuma | ................. | G11C 16/08 |
| | | | | | 365/185.11 |
| 2007/0047313 | A1 * | 3/2007 | Hosono | ............... | G11C 11/5628 |
| | | | | | 365/185.17 |

(Continued)

FOREIGN PATENT DOCUMENTS

| KR | 1020090096879 | 9/2009 |
|---|---|---|
| KR | 101083680 | 11/2011 |

(Continued)

*Primary Examiner* — Hoai V Ho
*Assistant Examiner* — Jay Radke
(74) *Attorney, Agent, or Firm* — IP & T Group LLP

(57) ABSTRACT

The semiconductor memory device includes: a memory unit having a plurality of memory blocks; a voltage supply circuit configured to generate a plurality of operating voltages and transmit the operating voltages to global word lines; and a pass unit coupled between respective local word lines of the plurality of memory blocks and the global word lines, and configured to couple the local word lines of a selected memory block to the global word lines in response to block select signals corresponding to the respective memory blocks, wherein the pass unit couples local word lines of an unselected memory block to the global word lines for a preset time and then isolates local word lines of the unselected memory block from the global word lines in response to the block select signals while coupling local word lines of the selected memory block to the global word lines.

18 Claims, 6 Drawing Sheets

(56) References Cited

U.S. PATENT DOCUMENTS

2008/0304322 A1\* 12/2008 Aritome ............ G11C 16/0483
　　　　　　　　　　　　　　　　　　　　　　　365/185.13

FOREIGN PATENT DOCUMENTS

| KR | 1020120053232 | 5/2012 |
| KR | 1020130031483 | 3/2013 |

\* cited by examiner

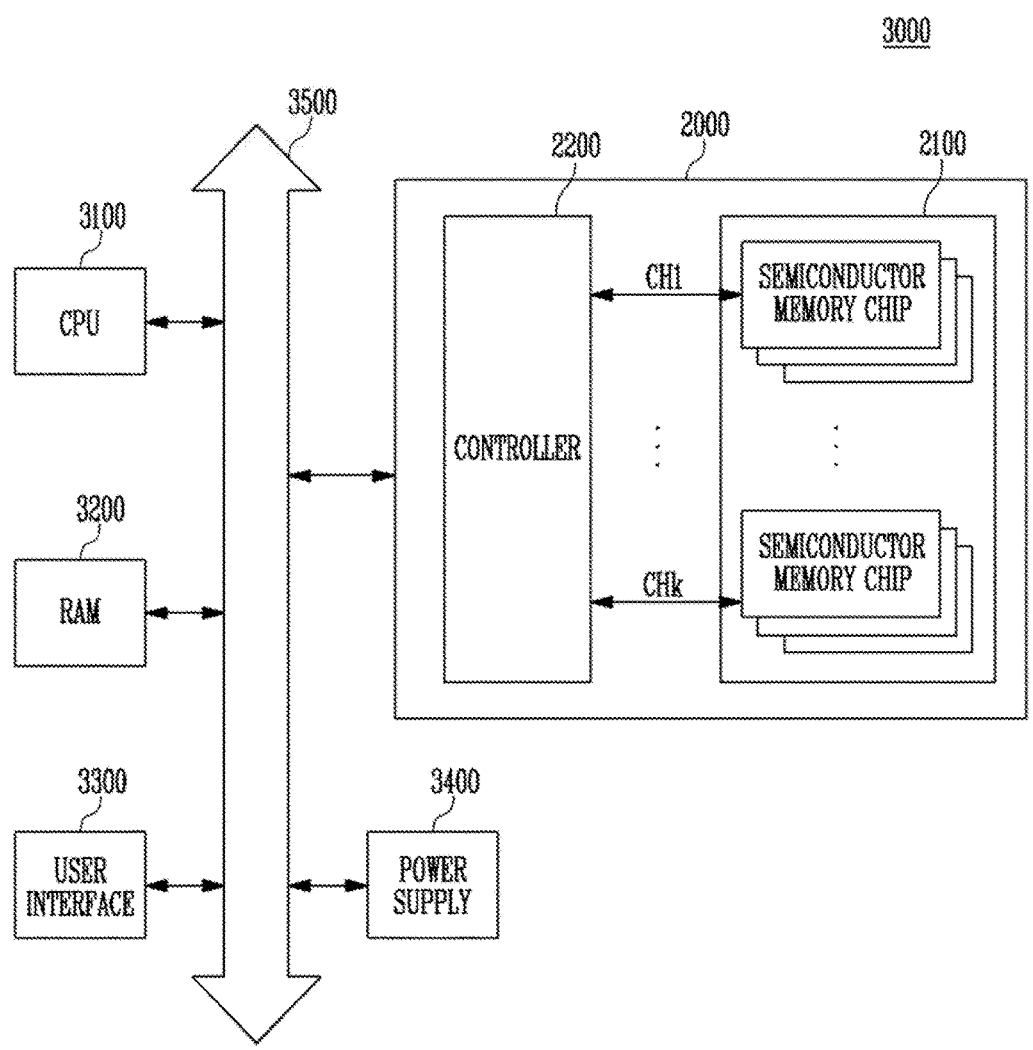

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2016-0098516 filed on Aug. 2, 2016, which is herein incorporated by reference in its entirety.

BACKGROUND

1. Field

Various embodiments of the present disclosure relate to an electronic device, and more particularly, to a semiconductor memory device and an operating method thereof.

2. Description of Related Art

Semiconductor devices, in particular, semiconductor memory devices are classified into volatile memory devices and nonvolatile memory devices.

Nonvolatile memory devices can maintain data stored therein even when power supply is interrupted, although they generally have lower read and write speeds than volatile memory devices. Therefore, nonvolatile memory devices are used when there is the need for storing data which must be maintained regardless of the status of the power supply. Representative examples of nonvolatile memory devices include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), Ferroelectric RAM (FRAM), etc. A flash memory may be a NOR flash memory or a NAND flash memory.

A flash memory combines advantages of both a RAM in which data is programmable and erasable and advantages of a ROM in which data stored therein can be retained even when power is interrupted. Flash memories are used widely as a storage medium of portable electronic devices such as a digital camera, a PDA (Personal Digital Assistant) and an MP3 player.

SUMMARY

Various embodiments of the present disclosure are directed to a semiconductor memory device capable of improving threshold voltage distribution of memory cells by preventing electrons from being trapped in a channel of an unselected memory block during a program operation, and an operating method thereof.

One embodiment of the present disclosure provides a semiconductor memory device including: a memory unit having a plurality of memory blocks; a voltage supply circuit configured to generate a plurality of operating voltages and transmit the operating voltages to global word lines; and a pass unit coupled between respective local word lines of the plurality of memory blocks and the global word lines, and configured to couple the local word lines of a selected memory block among the plurality of memory blocks to the global word lines in response to block select signals corresponding to the respective memory blocks, wherein the pass unit couples local word lines of an unselected memory block among the plurality of memory blocks to the global word lines for a preset time and then isolates local word lines of the unselected memory block from the global word lines in response to the block select signals while coupling local word lines of the selected memory block to the global word lines.

Another embodiment of the present disclosure provides a semiconductor memory device including: a memory unit having first and second memory blocks; a voltage supply circuit configured to generate a plurality of operating voltages and transmit the operating voltages to global word lines; a first pass circuit coupled between first word lines of the first memory block and the global word lines, and configured to couple or isolate the first word lines to or from the global word lines in response to a first block select signal; and a second pass circuit coupled between second word lines of the second memory block and the global word lines, and configured to couple or isolate the second word lines to or from the global word lines in response to a second block select signal, wherein when the first memory block is selected during a program operation, the second pass circuit couples the second word lines to the global word lines for a preset time and then isolates the second word lines from the global word lines.

Another embodiment of the present disclosure provides an operating method of a semiconductor memory device, including: applying operating voltages to word lines of a selected memory block among the plurality of memory blocks in response to a program command; and precharging word lines of an unselected one among the plurality of memory blocks to a predetermined level and then floating local word lines of the unselected memory block during the applying of the operating voltages.

Another embodiment of the present disclosure provides a semiconductor memory device including: a plurality of memory blocks; and a pass unit configured to precharge word lines of an unselected one among the memory blocks for a preset time and then float local word lines of the unselected memory block while applying an operating voltage to word lines of a selected one among the memory blocks in response to a program command.

BRIEF DESCRIPTION OF THE DRAWINGS

Example embodiments will now be described more fully hereinafter with reference to the accompanying drawings;

FIG. 7 is a block diagram showing a computing system including the memory system illustrated with reference to FIG. 6.

DETAILED DESCRIPTION

Figure 1:
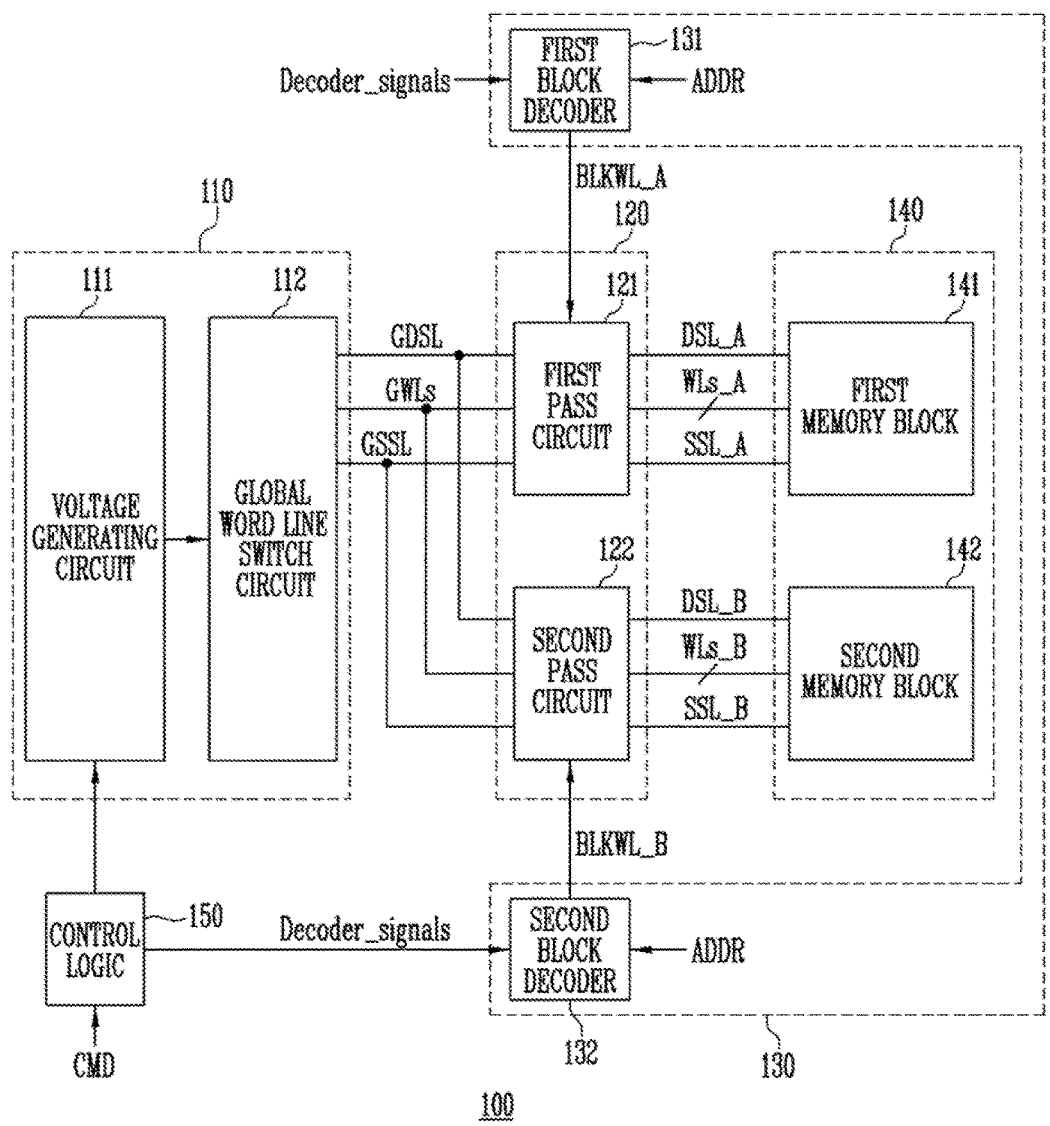
FIG. 1 is a block diagram illustrating a semiconductor memory device according to an embodiment of the present disclosure.

Hereinafter, various embodiments of the present invention will be described in greater detail with reference to the accompanying drawings. However, it is noted that the present invention may be embodied in different other forms and should not be construed as limited only to the embodiments set forth herein. Rather, these embodiments are provided so that this disclosure will be thorough and complete, and will fully convey the invention to those skilled in the art.

In the drawing figures, dimensions may be exaggerated for clarity of illustration.

Embodiments are described herein with reference to simplified schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural form as long as it is not stated otherwise in a sentence. Furthermore, the terms "include," "comprise," or "including," and "comprising" as used in the specification and the claims are inclusive terms referring to one or more stated and do not preclude the addition of other elements.

Furthermore, unless defined otherwise, all the terms used in this specification including technical and scientific terms have the same meanings as would be generally understood by those skilled in the related art in view of the present disclosure. The terms defined in generally used dictionaries should be construed as having the same meanings as would be construed in the context of the present disclosure and the related art, and unless clearly defined otherwise in this specification, should not be construed as having idealistic or overly formal meanings.

It is also noted that in this specification, that "connected" or "coupled" refers to one component not only directly coupled to another component but also indirectly coupled to another component through an intermediate component. On the other hand, "directly connected" or "directly coupled" refers to one component directly coupled to another component without an intermediate component.

It will be understood that when an element is referred to as being "between" two elements, it can be the only element between the two elements, or one or more intervening elements may also be present It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a semiconductor memory device 100 according to an embodiment of the present disclosure.

Referring to FIG. 1, the semiconductor memory device 100 includes a voltage supply circuit 110, a pass unit 120, a block decoder circuit 130, a memory unit 140, and a control logic 150.

The voltage supply circuit 110 includes a voltage generating circuit 111 and a global word line switch circuit 112.

The voltage generating circuit 111 generates a plurality of operating voltages for various operations of the semiconductor memory device 100 and outputs them to the global word line switch circuit 112. For example, in a program operation, the voltage generating circuit 111 generates a program voltage to be applied to a selected word line, a pass voltage to be applied to unselected word lines respectively, and select transistor control voltages to be applied to a drain select line and a source select line.

The global word line switch circuit 112 switches and transfers the plurality of operating voltages from the voltage generating circuit 111 to the global word lines GDSL, GWLs and GSSL.

The pass unit 120 includes a first and a second pass circuits which correspond to respective memory blocks included in the memory unit 140. It is noted that in the embodiment of FIG. 1, for the sake of explanation, descriptions are made for a case where the memory unit 140 includes a first memory block 141 and a second memory block 142, and the pass unit 120 includes a first pass circuit 121 corresponding to the first memory block 141, and a second circuit 122 corresponding to the second memory block 142. However, it should be understood that the invention is not limited by the number of memory blocks and corresponding pass circuits. Generally, the memory device may include a plurality of memory blocks operatively coupled to a plurality of pass circuits.

The first pass circuit 121 is coupled between the global word lines GDSL, GWLs and GSSL and local word lines DSL_A, WLs_A and SSL_A of the first memory block 141. The term global word lines is used herein to encompass global word lines GWLs, and global drain and source select lines GDSL and GSSL. Also, the term local word lines is used herein to encompass local word lines WLs_A and WLS_B, and local drain and source select lines DSL_A, DSL_B, SSL_A. The first pass circuit 121 couples or isolates the global word lines GDSL, GWLs and GSSL to or from the local word lines DSL_A, WLs_A and SSL_A in response to a first block select signal BLKWL_A received form the first block decoder 131. For example, when the first memory block 141 is a selected memory block during a program operation, the first pass circuit 121 couples the global word lines GDSL, GWLs and GSSL to the local word lines DSL_A, WLs_A and SSL_A in response to the first block select signal BLKWL_A that is high-enabled. Furthermore, when the first memory block 141 is an unselected memory block in a program operation, in response to a first block select signal BLKWL_A that is high-enabled for a preset time, the first pass circuit 121 couples the global word lines GDSL, GWLs and GSSL to the local word lines DSL_A, WLs_A and SSL_A for the preset time of the high-enabled first block select signal BLKWL_A, and thus precharges the local word lines DSL_A, WLs_A and SSL_A to a predetermined level. Then, the first pass circuit 121 electrically isolates according to the low-disabled (e.g., low-disabled to a ground voltage level) first block select signal BLKWL_A the global word lines GDSL, GWLs and GSSL from the local word lines DSL_A, WLs_A and SSL_A, and thus floats the local word lines DSL_A, WLs_A and SSL_A.

The second pass circuit 122 is coupled between the global word lines GDSL, GWLs and GSSL and word lines DSL_B, WLs_B and SSL_B of the second memory block 142. The second pass circuit 122 couples or isolates the global word lines GDSL, GWLs and GSSL to or from local word lines DSL_B, WLs_B and SSL_B in response to a second block select signal BLKWL_B received from the second block decoder 132. For example, when the second memory block 142 is a selected memory block in a program operation, the second pass circuit 122 couples the global word lines GDSL, GWLs and GSSL to local word lines DSL_B, WLs_B and SSL_B in response to a second block select signal BLKWL_B that is high-enabled. Furthermore, when the second memory block 142 is an unselected memory block during a program operation, in response to a second block select signal BLKWL_B that is high-enabled for a preset time, the second pass circuit 122 couples the global word lines GDSL, GWLs and GSSL to local word lines DSL_B, WLs_B and SSL_B for the preset time of the high-enabled second block select signal BLKWL_B, and thus precharges local word lines DSL_B, WLs_B and SSL_B to a predetermined level. Then, the second pass circuit 122 electrically isolates according to the low-disabled (e.g., low-disabled to a ground voltage level) second block select signal BLKWL_B the global word lines GDSL, GWLs and GSSL from local word lines DSL_B, WLs_B and SSL_B, and thus floats local word lines DSL_B, WLs_B and SSL_B.

The block decoder circuit 130 includes a plurality of block decoders which correspond to the respective memory blocks included in the memory unit 140. In the embodiment of the present disclosure, for the sake of explanation, descriptions will be made for the case where the block decoder circuit 130 includes the first block decoder 131 corresponding to the first memory block 141, and the second block decoder 132 corresponding to the second memory block 142.

The block decoder circuit 130 generates the first block select signal BLKWL_A and the second block select signal BLKWL_B in response to address signals ADDR and decoder control signals Decoder_signals received from the control logic 150

The first block decoder 131 generates the first block select signal BLKWL_A and outputs the first block select signal BLKWL_A to the first pass circuit 121 in response to an address signal ADDR and a decoder control signal Decoder_signals. For example, when the first memory block 141 is a selected memory block and the second memory block 142 is an unselected memory block in a program operation, the first block decoder 131 generates the first block select signal BLKWL_A that is high-enabled in response to an address signal ADDR corresponding to the first memory block. In addition, when the second memory block 142 is a selected memory block and the first memory block 141 is an unselected memory block during a program operation, the first block decoder 131 generates a first block select signal BLKWL_A that is high-enabled for a preset time and then low-disabled in response to an address signal ADDR corresponding to the second memory block.

The second block decoder 132 generates the second block select signal BLKWL_B and outputs the second block select signal BLKWL_B to the second pass circuit 122 in response to an address signal ADDR and a decoder control signal Decoder_signals. For example, when the second memory block 142 is a selected memory block and the first memory block 141 is an unselected memory block during a program operation of the semiconductor memory device, the second block decoder 132 generates the second block select signal BLKWL_B that is high-enabled in response to an address signal ADDR corresponding to the second memory block. In addition when the first memory block 141 is a selected memory block and the second memory block 142 is an unselected memory block, during a program operation, the second block decoder 132 generates a second block select signal BLKWL_B that is high-enabled for a preset time and then low-disabled in response to an address signal ADDR corresponding to the first memory block.

The memory unit 140 may include a plurality of memory blocks. In the embodiment of the present disclosure, for the sake of explanation, descriptions will be made for the case where the memory unit 140 includes the first memory block 141 and the second memory block 142.

In the memory unit 140, each of the first and second memory blocks 141 and 142 includes a plurality of memory cells. In an embodiment, the plurality of memory cells may be nonvolatile memory cells. Memory cells coupled to the same word line among the plurality of memory cells are defined as a single page. Furthermore, each of the first and second memory blocks 141 and 142 includes a plurality of strings.

The first memory block 141 and the second memory block 142 may share a common source line and bit lines.

Detailed configuration of each of the first and second memory blocks 141 and 142 will be described later herein.

The control logic 150 controls the voltage supply circuit 110 and the block decoder circuit 130 in response to a command signal CMD inputted from the outside. For example, in response to a program command pertaining to a program operation, the control logic 150 controls the voltage generating circuit 111 to generate the plurality of operating voltages. Furthermore, the control logic 150 generates the decoder control signals Decoder_signals for controlling a block decoder corresponding to a selected memory block among the first and second block decoders 131 and 132 to output the high-enabled first or second block select signal BLKWL_A or BLKWL_B, and controlling a block decoder corresponding to an unselected memory block among the first and second block decoders 131 and 132 to output the first or second block select signal BLKWL_A or BLKWL_B that is high-enabled for a preset time and then low-disabled.

Figure 2:
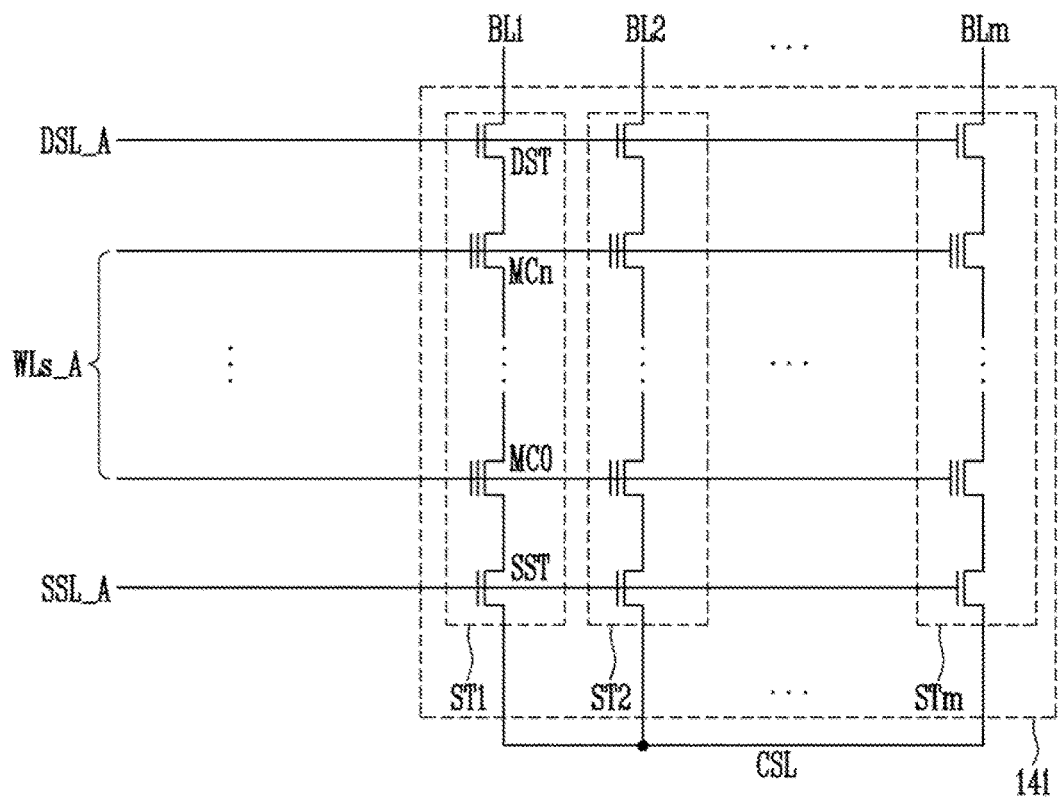
FIG. 2 is a detailed circuit diagram of a memory block shown in FIG. 1.

FIG. 2 is a detailed circuit diagram of the first memory block 141 among the memory blocks included in the memory unit 140.

The first memory block 141 and the second memory block 142 of FIG. 1 have the same structure; therefore, for the sake of explanation, only the first memory block 141 will be described below.

The first memory block 141 includes a plurality strings ST1 to STm which are respectively coupled between a common source line CSL and a plurality of bit lines BL1 to BLm.

The plurality of strings ST1 to STm have the same structure. The first string ST1 includes a source select transistor SST, a plurality of memory cells MC0 to MCn and a drain select transistor DST which are coupled in series between the common source line CSL and the bit line BL1.

Gates of the plurality of memory cells MC0 to MCn are coupled to the respective second word lines WLs_A. A gate of the drain select transistor DST of each string is coupled to the drain select line DSL_A. A gate of the source select transistor SST of each string is coupled to the source select line SSL_A.

Figure 3:
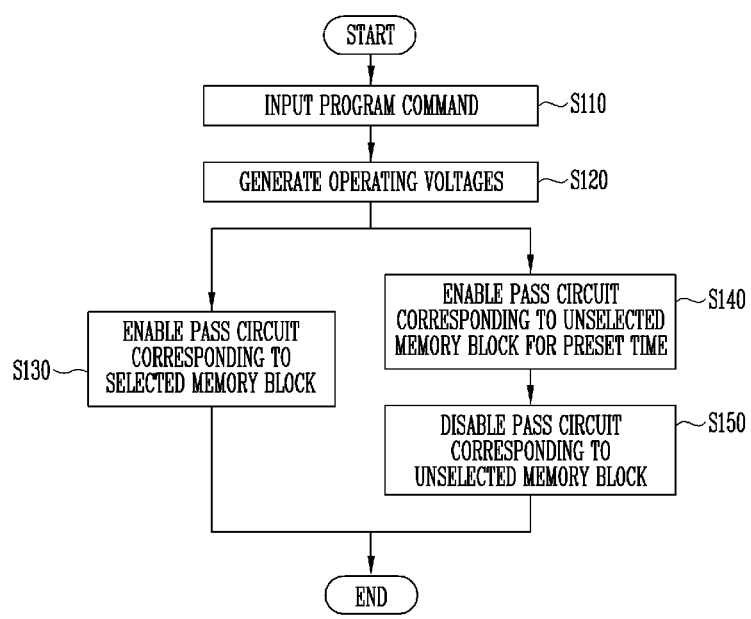
FIG. 3 is a flowchart illustrating an operating method of the semiconductor memory device according to an embodiment of the present disclosure.

FIG. 3 is a flowchart illustrating an operating method of the semiconductor memory device 100 according to an embodiment of the present disclosure.

Figure 4:
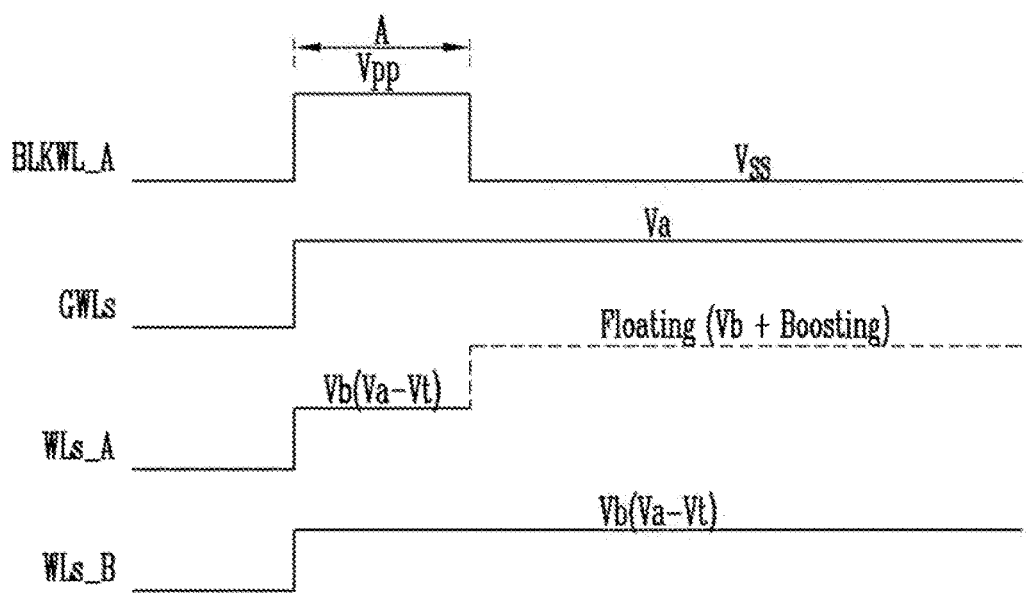
FIG. 4 is a waveform diagram illustrating the operating method of FIG. 3.

FIG. 4 is a waveform diagram illustrating the operating method of FIG. 3.

Table 1 illustrates various potential levels of global word lines of a selected memory block and an unselected memory block during a program operation of the semiconductor memory device 100.

TABLE 1

| | Selected memory block | | | Unselected memory block | | |
|---|---|---|---|---|---|---|
| | Global word line | Block select signal | Word lines and Select line | Global word line | Block select signal | Word lines and Select line |
| GSSL/SSL | Source select transistor turn on voltage | High voltage (Vpp) | Source select transistor turn on voltage | Source select transistor turn on voltage | High voltage (Vpp) → Ground voltage | Source select transistor turn on voltage → Floating |
| GDSL/DSL | Drain select transistor turn on voltage | | Drain select transistor turn on voltage | Drain select transistor turn on voltage | (Vss) | Drain select transistor turn on voltage → Floating |
| GWLs/WLs | Program voltage or Pass voltage (Va) | | Program voltage or Pass voltage (Vb = Va − Vt) | Program voltage or Pass voltage (Va) | | Program voltage or Pass voltage (Vb = Va − Vt) → Floating |

Descriptions will be made for an exemplary case where, during a program operation, the first memory block 141 is unselected while the second memory block 142 is selected.

The program operation of the semiconductor memory device according to the embodiment of the present invention will be described with reference to FIG. 1 to FIG. 4 and Table 1.

Input of a Program Command (S110)

When a command signal CMD pertaining to a program operation is inputted from the outside, the control logic 150 generates control signals for controlling the voltage supply circuit 110 and the block decoder circuit 130.

Generation of Operating Voltages (S120)

The voltage generating circuit 111 of the voltage supply circuit 110 generates a plurality of operating voltages Va for the program operation under the control of the control logic 150. For example, the voltage generating circuit 111 generates a program voltage, a pass voltage, a select transistor control voltage, etc.

The global word line switch circuit 112 switches the plurality of operating voltages Va generated from the voltage generating circuit 111 and transmits the operating voltages Va to the global word lines GDSL, GWLs and GSSL.

Enablement of a Pass Circuit Corresponding to the Selected Memory Block (S130)

The second block decoder 132 corresponding to the selected second memory block 142 generates and outputs the second block select signal BLKWL_B that is high-enabled to a high-voltage level Vpp in response to the decoder control signal Decoder_signals and an address ADDR that are outputted from the control logic 150.

Enablement of a Pass Circuit Corresponding to the Unselected Memory Block for a Preset Time (S140)

Along with the above-mentioned step S130, the first block decoder 131 corresponding to the unselected first memory block 141 generates and outputs the first block select signal BLKWL_A that is high-enabled to a high-voltage level Vpp for a preset time A in response to a decoder control signal Decoder_signals and an address ADDR that are outputted from the control logic 150.

Disablement of the Pass Circuit Corresponding to the Unselected Memory Block (S150)

After the above-mentioned step S140, the first block decoder 131 corresponding to the unselected first memory block 141 low-disables the first block select signal BLKWL_A in response to a decoder control signal Decoder_signals and an address ADDR that are outputted from the control logic 150.

By the above-mentioned step S130, the second pass circuit 122 couples the global word lines GDSL, GWLs and GSSL to local word lines DSL_B, WLs_B and SSL_B in response to the second block select signal BLKWL_B high-enabled to the high-voltage level Vpp. Therefore, a plurality of operating voltages Va transmitted through the global word lines GDSL, GWLs and GSSL are transmitted to local word lines DSL_B, WLs_B and SSL_B of the second memory block 142. The plurality of operating voltages Va are reduced by threshold voltages Vt of transistors included in the second pass circuit 122, whereby the potential levels of local word lines DSL_B, WLs_B and SSL_B may become a predetermined level Vb (i.e., Vb=Va−Vt).

By the above-mentioned step S140, the first pass circuit 121 couples the global word lines GDSL, GWLs and GSSL to the local word lines DSL_A, WLs_A and SSL_A for the preset time A in response to the first block select signal BLKWL_A high-enabled to the high-voltage level Vpp for the preset time. Thereby, the local word lines DSL_A, WLs_A and SSL_A of the unselected first memory block 141 are precharged to the predetermined level Vb. After the preset time A has passed, the first pass circuit 121 interrupts the coupling of the global word lines GDSL, GWLs and GSSL to the local word lines DSL_A, WLs_A and SSL_A in response to the first block select signal BLKWL_A that is low-disabled to the ground voltage level Vss. Thus, the local word lines DSL_A, WLs_A and SSL_A enter a floating state and each have a predetermined potential level due to a boosting phenomenon in which the level of local word lines is boosted by a predetermined potential level depending on conditions of a peripheral memory block. Therefore, a hot hole is restricted from being formed in a lower channel of the source select transistor due to local word lines each having the boosted predetermined potential level.

Figure 5:
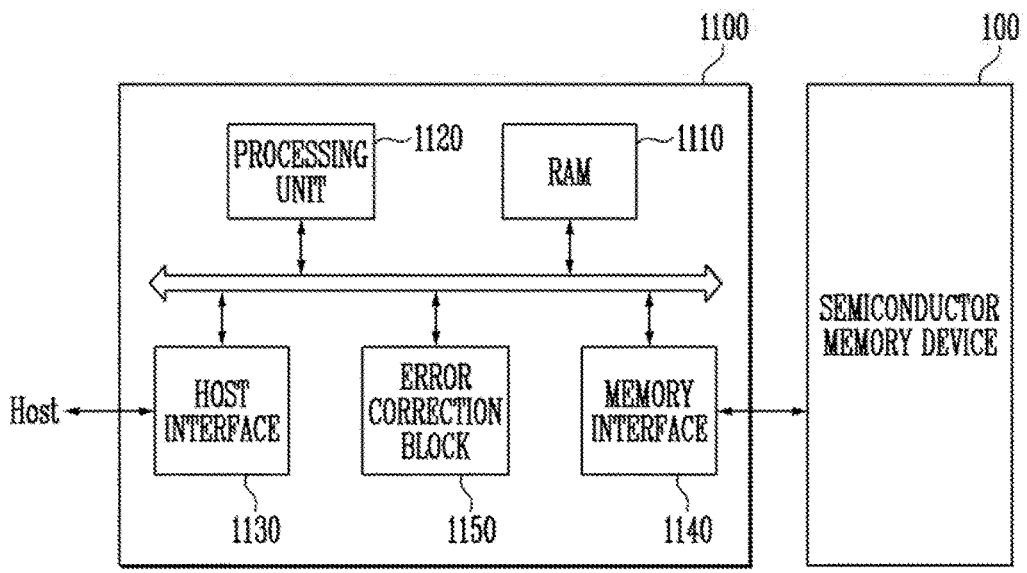
FIG. 5 is a block diagram showing a memory system including the semiconductor memory device of FIG. 1.

FIG. 5 is a block diagram showing a memory system including the semiconductor memory device of FIG. 1.

Referring to FIG. 5, the memory system 1000 includes a semiconductor memory device 100 and a controller 1100.

The semiconductor memory device 100 may have the same configuration and operation as the semiconductor memory device described with reference to FIG. 1. Hereinafter, repetitive explanations will be omitted.

The controller 1100 is coupled to a host Host and the semiconductor memory device 100. The controller 1100 is configured to access the semiconductor memory device 100 in response to a request from the host Host. For example, the controller 1100 may be configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (Random Access Memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 includes a protocol for performing data exchange between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 provides an interface between the controller 1100 and the semiconductor memory device 100. Any suitable memory interface may be employed. For example, the memory interface may include a NAND interface or a NOR interface when the semiconductor device 100 is a NAND or a NOR flash memory respectively.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100. Any suitable error correction code may be employed.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device forming a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 2000 may be improved significantly.

In another embodiment, the memory system 1000 may be provided as an element of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, and the like.

In an exemplary embodiment, the semiconductor memory device 100 or the memory system 1000 may be embedded in various types of packages. For example, the semiconductor memory device 100 or the memory system 2000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 6:
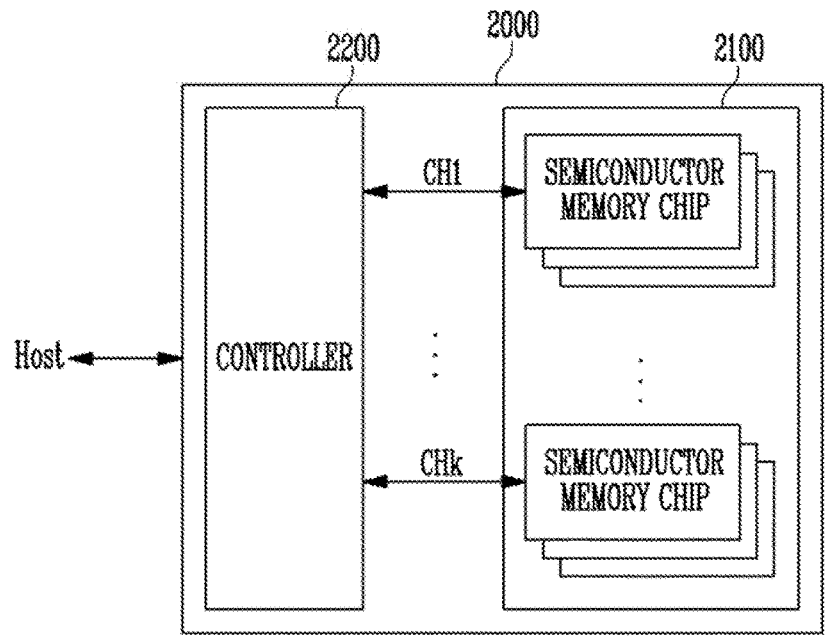
FIG. 6 is a block diagram showing an application example of the memory system of FIG. 5.

FIG. 6 is a block diagram showing an application example of the memory system of FIG. 5.

Referring FIG. 6, the memory system 2000 includes a semiconductor memory device 2100 and a controller 2200. The semiconductor memory device 2100 includes a plurality of memory chips. The semiconductor memory chips are divided into a plurality of groups.

In FIG. 6, it is illustrated that each of the plurality of groups communicates with the controller 2200 through first to k-th channels CH1 to CHk. Each semiconductor memory chip may have the same configuration and operation as those of the semiconductor memory device 100 described with reference to FIG. 1.

Each group communicates with the controller 2200 through one common channel. The controller 2200 has the same configuration as that of the controller 1100 described with reference to FIG. 5 and is configured to control a plurality of memory chips of the semiconductor memory device 2100 through the plurality of channels CH1 to CHk.

FIG. 7 is a block diagram showing a computing system including the memory system illustrated with reference to FIG. 6.

Referring to FIG. 7, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 7, the semiconductor memory device 2100 is illustrated as being coupled to the system bus 3500 through the controller 2200. However, the semiconductor memory device 2100 may be directly coupled to the system bus 3500 in which case the function of the controller 2200 may be performed by the CPU 3100 and the RAM 3200.

In FIG. 7, the memory system 2000 described with reference to FIG. 6 is being employed. However, the memory system 2000 may be replaced with the memory system 1000 described with reference to FIG. 5. In an embodiment, the computing system 3000 may include both of the memory systems 1000 and 2000 described with reference to FIGS. 5 and 6.

As described above, according to the present disclosure, during a program operation of a semiconductor memory device, voltages of word lines and select lines of an unselected memory block are controlled so that electrons are prevented from being trapped in a channel of the unselected memory block. Thereby, threshold voltage distribution of the unselected memory block may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
   a memory unit having a plurality of memory blocks;
   a voltage supply circuit configured to generate a pass voltage and a program voltage and transmit the pass voltage and the program voltage to global word lines; and
   a pass unit coupled between respective local word lines of the plurality of memory blocks and the global word lines, and configured to couple the local word lines of a selected memory block among the plurality of memory blocks to the global word lines in response to block select signals corresponding to the respective memory blocks,
   wherein the pass unit precharges the local word lines of an unselected memory block to a predetermined level for a preset time by the pass voltage and the program voltage transmitted through the global word lines and then floats the local word lines of the unselected memory block in a portion of an interval at which the local word lines of the selected memory block and the global word lines are coupled to each other.

2. The semiconductor memory device according to claim 1, further comprising:
   a control logic configured to generate a decoder control signal in response to a command signal related to a program operation; and
   a block decoder circuit configured to generate the block select signals in response to the decoder control signal and an address signal.

3. The semiconductor memory device according to claim 2,
   wherein the pass unit comprises a plurality of pass circuits corresponding to the respective memory blocks, and
   wherein each of the plurality of pass circuits electrically couples or isolates local word lines of a corresponding one of the plurality of memory blocks to or from the global word lines in response to a corresponding one of the block select signals.

4. The semiconductor memory device according to claim 2,
   wherein the block decoder circuit comprises a plurality of block decoders corresponding to the respective memory blocks,
   wherein each of the plurality of block decoders outputs a corresponding one of the block select signals that is enabled when the address signal represents a corresponding memory block, and
   wherein each of the plurality of block decoders outputs a corresponding one of the block select signals that is enabled for the preset time and then disabled when the address signal does not represent a corresponding memory block.

5. A semiconductor memory device comprising:
   a memory unit having first and second memory blocks;
   a voltage supply circuit configured to generate a pass voltage and a program voltage and transmit the pass voltage and the program voltage to global word lines;
   a first pass circuit coupled between first word lines of the first memory block and the global word lines, and configured to couple or isolate the first word lines to or from the global word lines in response to a first block select signal; and
   a second pass circuit coupled between second word lines of the second memory block and the global word lines, and configured to couple or isolate the second word lines to or from the global word lines in response to a second block select signal,
   wherein when the first memory block is selected during a program operation, the second pass circuit precharges the second word lines to a predetermined level for a preset time by the pass voltage and the program voltage transmitted through the global word lines and then floats the second word lines.

6. The semiconductor memory device according to claim 5, further comprising:
   a control logic configured to generate a decoder control signal in response to a command signal related to the program operation; and
   a block decoder circuit configured to generate the first and second block select signals in response to the decoder control signal and an address signal.

7. The semiconductor memory device according to claim 6, wherein the block decoder circuit comprises:

a first block decoder corresponding to the first memory block and configured to generate the first block select signal in response to the decoder control signal and the address signal; and a second block decoder corresponding to the second memory block and configured to generate the second block select signal in response to the decoder control signal and the address signal.

8. The semiconductor memory device according to claim 7, wherein when the first memory block is selected during the program operation, the first block decoder generates the first block select signal that is enabled, and the second block decoder generates the second block select signal that is enabled for the preset time and then disabled.

9. The semiconductor memory device according to claim 8, wherein when the first memory block is selected during the program operation, the first pass circuit electrically couples the first word lines to the global word lines in response to the first block select signal such that the pass voltage and the program voltage are transferred to the first word lines.

10. The semiconductor memory device according to claim 9, wherein when the first memory block is selected during the program operation, the second pass circuit couples the second word lines to the global word lines for the preset time and then isolates the second word lines from the global word lines in response to the second block select signal.

11. An operating method of a semiconductor memory device including a memory unit having a plurality of memory blocks, the method comprising:
generating a pass voltage and a program voltage according to a program command;
applying the pass voltage and the program voltage to local word lines of a selected memory block among the plurality of memory blocks; and
precharging local word lines of an unselected one among the plurality of memory blocks to a predetermined level for a present time by the pass voltage and the program voltage and then floating the local word lines of the unselected memory block during the applying of the pass voltage and the program voltage to the local word lines of the selected memory block.

12. A semiconductor memory device comprising:
a plurality of memory blocks; and
a pass unit configured to precharge local word lines of an unselected one among the memory blocks for a preset time by a pass voltage and a program voltage and then float the local word lines of the unselected memory block while applying the pass voltage and the program voltage to local word lines of a selected one among the memory blocks in response to a program command.

13. The semiconductor memory device of claim 12, wherein the pass unit precharges the local word lines of the unselected memory block for the preset time by applying the pass voltage and the program voltage to the local word lines of the unselected memory block for the preset time.

14. The semiconductor memory device of claim 13,
wherein the memory blocks include first and second memory blocks, and
wherein the pass unit includes:
a first pass circuit configured to selectively providing the pass voltage and the program voltage to first word lines of the first memory block in response to a first block select signal; and
a second pass circuit configured to selectively providing the pass voltage and the program voltage to second word lines of the second memory block in response to a second block select signal.

15. The semiconductor memory device of claim 14, further comprising:
a first block decoder configured to enable the first block select signal in response to a memory selection signal representing the first memory block; and
a second block decoder configured to enable the second block select signal in response to the memory selection signal representing the second memory block.

16. The semiconductor memory device of claim 15, wherein when the memory selection signal represents the first memory block during a program operation corresponding to the program command, the first block decoder enables the first block select signal, and the second block decoder enables for the preset time and then disables the second block select signal.

17. The semiconductor memory device of claim 16,
wherein the first pass circuit provides the pass voltage and the program voltage to first word lines while the first block select signal stays enabled, and
wherein the second pass circuit provides the pass voltage and the program voltage to the second word lines while the second block select signal stays enabled.

18. The semiconductor memory device of claim 17 wherein the semiconductor memory device is a flash NAND memory.

* * * * *